United States Patent [19]

Bowden et al.

[11] 3,884,696

[45] May 20, 1975

[54] POSITIVE PHOTORESIST COMPRISING POLYSULFONES FORMED BY REACTING VINYL AROMATIC HYDROCARBONS WITH SULFUR DIOXIDE

[75] Inventors: Murrae John Stanley Bowden, Chatham; Edwin Arthur Chandross, Berkeley Heights, both of N.J.

[73] Assignee: Bell Telephone Laboratories, Incorporated, Murray Hill, N.J.

[22] Filed: Mar. 5, 1974

[21] Appl. No.: 448,399

[52] U.S. Cl. .................... 96/35; 96/35.1; 96/115 R; 117/93.31; 204/159.14; 260/79.3 A

[51] Int. Cl. .......... G03c 5/00; B01j 1/10; B01j 1/12

[58] Field of Search ........... 117/93.31; 96/35.1, 35; 204/159.14; 260/79.3 A

[56] References Cited

UNITED STATES PATENTS

| | | | |
|---|---|---|---|
| 3,535,137 | 10/1970 | Haller et al. | 117/8 |
| 3,585,118 | 6/1971 | Harada et al. | 204/159.22 |

OTHER PUBLICATIONS

Chemical Abstracts, Vol. 72, 1970, No. 122,151g.

Chemical Abstracts, Vol. 73, 1970, No. 4485s.

*Primary Examiner*—Murray Tillman
*Assistant Examiner*—Richard B. Turer
*Attorney, Agent, or Firm*—E. M. Fink

[57] ABSTRACT

A technique is described for the generation of a patterned relief image in a sensitive positive photoresist comprising a polysulfone formed by reacting vinyl aromatic hydrocarbons with sulfur dioxide. Pattern generation is effected by exposure of the polysulfone to ultraviolet radiation of a wavelength within the range of 1,700–4,000 A. and selective removal of the exposed portion with a suitable solvent.

5 Claims, No Drawings

POSITIVE PHOTORESIST COMPRISING POLYSULFONES FORMED BY REACTING VINYL AROMATIC HYDROCARBONS WITH SULFUR DIOXIDE

This invention relates to a technique for the generation of a patterned relief image. More particularly, the present invention relates to the generation of a patterned relief image in light sensitive positive resists comprising arylated polysulfones.

The photoresists commonly utilized in conventional applications depend upon the rearrangement and hydration of quinone diazides to form carboxylic acids which solubilize the resist in mild alkali. Process operations employing such resists have been less than totally satisfactory, such dissatisfaction being occasioned by the fact that the resist solutions are complex mixtures and batch-to-batch variations in properties adversely affect development procedures. Difficulties have also been encountered with positive resists used in conjunction with GaAs substrates, the latter being subject to attack by developing solutions, so leading to undercutting of the resist with the attendant loss of resolution. In order to obviate such prior art limitations, workers in the art have focused their interest upon the development of new types of positive resists.

In accordance with the present invention, there is disclosed a group of novel photoresists which are structurally akin to the recently described electron sensitive aliphatic olefin-sulfur dioxide copolymers (which do not absorb ultraviolet light in a useful range of the spectrum, that is, from 2000 to 4000 A). The novel resists function as positive resists and evidence significant differential solubility characteristics subsequent to selective irradiation.

As noted, the described resists are polysulfones, the molecules of which contain a plurality of sulfone linkages which are broken by radiant energy of a sufficient level so that the molecules are converted to units of a lower molecular weight. The polysulfones described herein have molecular structures which can be characterized as being formed of either of the following repeating units.

(a) $$\left[\left[CH_2 - \underset{R}{\underset{|}{CH}}\right]_m - SO_2\right]$$

and (b) $$\left[\left[\underset{R'}{CH - CH}\right]_m - SO_2\right]$$

wherein $m$ is an integer having a value of at least 1 and R is an aromatic hydrocarbon capable of absorbing light in the range of 1,700 to 4,000 A, R is an aromatic hydrocarbon selected from the group comprising phenyl, biphenyl, naphthyl, ortho methylenephenyl, phenanthryl, anthracyl and fluoranthryl radicals and R′ is a 1,8 naphthylidene radical.

These repeating units are linear in nature and therefore the molecular segments remaining after the breaking of a sufficient proportion of the sulfone linkages will be more soluble and thus selectively removable from the substrate by solution. The presence of the aromatic radicals makes the polymer sensitive to ultraviolet radiation whereas exposure to higher energy radiation such as X-rays or the electron beam is required for the aliphatic olefin-sulfur dioxide resists alluded to above.

A general outline of a method suitable for use in the preparation of patterned resists in accordance with the present invention is set forth below. Certain operating parameters and ranges as well as the type of materials employed are indicated.

The described resists are polysulfones containing aromatic hydrocarbons which evidence photochemical cleavage of the benzylic carbon sulfur dioxide bond when exposed to ultraviolet radiation. These polysulfones have molecular structures characterized as being formed of the repeating units set forth above.

These repeating units are linear and therefore the molecular fragments remaining after the breaking of a sufficient proportion of the sulfone linkage will be soluble and, thus, selectively removable from the substrate by solution. The substituents at R are aromatic hydrocarbons and may be selected from among any of the light absorbing aromatics previously noted. Studies have revealed that large aromatic systems have greater ultraviolet absorbance at somewhat longer wavelengths so resulting in enhanced overall absorption in the useful region of the spectrum.

Since the polysulfone coating is most readily deposited upon the substrate from a solution in a volatile solvent, the advantageous polysulfones for the purpose of the invention are those which are soluble in such a solvent.

These polysulfones are advantageously reaction products of sulfur dioxide with vinyl aromatic hydrocarbons. Vinyl aromatics particularly suitable in the practice of the present invention are indene, styrene, vinylnaphthalene, vinylbiphenyl, acenaphthalene, vinylphenanthrene, vinylfluoranthene, vinylanthracene and mixtures thereof. These materials are conveniently obtained from commercial sources.

In the preparation of the desired polysulfone, many conventional techniques which are known to those skilled in the art may be utilized. A typical procedure involves effecting polymerization of the reactant in the absence of air in a suitable reaction vessel at temperatures ranging from 0° to 50°C. A conventional thermal polymerization initiator and a cationic polymer inhibitor are employed in the process. Following polymerization, the polymer is precipitated, dissolved in a suitable solvent, reprecipitated and dried. Solvents found to be particularly useful for this purpose are methyl ethyl ketone, dioxane, chloroform and so forth. It will be understood by those skilled in the art that selection of a particular solvent is dictated by the solubility of the polysulfone. The polymer in solution is then coated upon a suitable substrate by conventional spin coating techniques. Final film thickness desirably ranges from 2,000 to 8,000 A. Although the resolution is enhanced by utilizing a thin film, the incidence of pinholes dictates a practical minimum of 2,000 A. At this stage in the process, a prebaking step is advantageously employed for the purpose of removing excess solvent and annealing strain in the coated film. A suitable program designed to attain this end would involve heating to temperatures above the transition temperature, typically within the range of 180°–200°C for a time period in excess of 30 minutes.

Thereafter, the areas of the coating which are to be removed to leave the desired resist pattern are exposed to a source of radiant energy, namely, ultraviolet radiation having a wavelength within the range of 1,700–4,000 A (to break sulfur-benzylic carbon linkages) for a dosage period sufficient to induce a solubility differential between the exposed and unexposed portions. The energy levels required are dictated by the wavelength of the source, the nature of the aromatic hydrocarbon chosen and the molecular weight of the polysulfone.

The radiation dosage which is applied may only be sufficient if the fraction of energy absorbed is enough to establish the desired differential solubility. The number of sulfone linkages to be broken is obviously dependent upon the original molecule size.

The next step in the processing involves developing the exposed coating. This end may be effected by utilizing a developer system typically comprising mixed solvents such as dioxane and isopropanol mixtures. The development procedure may conveniently involve soaking or spraying the exposed film with a suitable developer for a time period ranging from 5–60 seconds. After development a post baking treatment from 30 to 120 minutes at a temperature range from 180° to 200°C may be employed for the purpose of evaporating developing solvents and enhancing adhesion characteristics. These parameters are dictated by the nature of the polysulfone selected.

EXAMPLE I

A solution of acenaphthalene (8.75 gms, 0.057 mole) in freshly distilled styrene (30 gms, 30.29 mole), containing azobisisobutyronitrile (0.1 gm) and dimethylformamide (5 milliliters) was outgassed by several freeze-thaw cycles. Following approximately 0.8 mole (50 gms) of sulfur dioxide was added to the solution and its container sealed, immersed in a water bath and maintained at 50°C for a time period of 72 hours. The resulting poly (styrene-acenaphthylene sulfone) (3:1:1) was precipitated into methanol. Then, it was redissolved twice in dioxane, reprecipitated and finally dried under vacuum at room temperature. The resultant polymer was dissolved in methoxyethyl acetate and spun upon a substrate comprising silicon dioxide on silicon using a conventional photoresist spinner to a thickness of approximately 5,000 A. The film was prebaked at 180°C for 30 minutes and then irradiated through a mask with a collimated light from a 200 watt high pressure mercury art source. The light was filtered through a Corning 7-56 filter which transmits the 220 to 400 nm range of the optical spectrum, the intensity of the resist surface being 20 milliwatts/sq.cm. as measured with a thermopile. Development of the exposed film was then effected by spraying the irradiated areas of the film with a solution comprising 60% dioxane and 40% isopropyl alcohol for 30 seconds.

Resolution was determined by exposing the resist through a contact mask and developing the image as described. Finally, the resist was postbaked at 180°C for 30 minutes and etched in buffered hydrofluoric acid. The resist absorbed strongly at 294 nm and continued to absorb out to 330 nm, the sensitivity being approximately 500 mJ/sq.cm. (0.50 J/sq.cm.).

EXAMPLE II

The procedure of Example I was repeated with the exception that a solution of vinylbiphenyl (2.0 gms, 0.011 mole) in sulfur dioxide (25 gms, 0.36 mole) containing azobisisobutyronitrile (0.05 gm) and dimethylformamide (5 milliliters) was employed. The resultant resist comprising poly (4-vinylbiphenyl sulfone) absorbed strongly at 250 nm and evidenced a sensitivity of 6,000 mJ/sq.cm.

EXAMPLE III

The procedure of Example I was repeated with the exception that a solution of styrene (8.0 gms, 0.08 mole) in sulfur dioxide (23 gms, 0.36 mole) containing azobisisobutyronitrile (0.05 gm) was employed. The resultant resist comprised poly (styrene sulfone) and absorbed at 265 nm with a sensitivity of 20 J/sq.cm.

What is claimed is:

1. The method of forming a patterned resist on the surface of a substrate which comprises exposing a portion of an arylated polysulfone film on said substrate to ultraviolet radiation having a wavelength within the range of 1,700–4,000 A for a time period sufficient to lower the molecular weight of the polysulfone, and selectively removing the exposed portion from said substrate, said polysulfone being selected from the group consisting of (a)

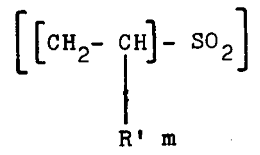

and (b)

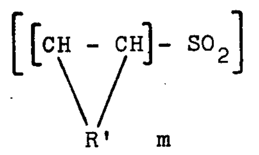

wherein *m* is an integer having a value of at least 1, R is an aromatic hydrocarbon radical selected from the group consisting of phenyl, biphenyl, naphthyl, phenanthyl, fluoroanthryl and anthracyl radicals and R' is a 1,8 naphthylidene radical.

2. Method in accordance with claim 1 wherein R is a 1.8 naphthylidene radical.

3. Method in accordance with claim 1 wherein said radical is a naphthyl radical.

4. Method in accordance with claim 1 wherein said radical is a phenyl radical.

5. The method of forming a patterned resist on the surface of a substrate which comprises exposing a portion of a film of a polysulfone, made up of polymer chains having recurring —CH — $SO_2$— linkages, on said substrate to sufficient radiation to lower the molecular weight of said exposed portion and selectively removing the exposed portion of lower molecular weight from said substrate, characterized in that the carbon atoms in said linkages in the initial polysulfone are bonded by one of their valences to the ring of an aromatic radical so as to render said linkages sensitive to ultraviolet radiation and characterized further in that the radiation to which said portions are exposed is ultraviolet radiation, said polysulfone being selected from the group consisting of (a) 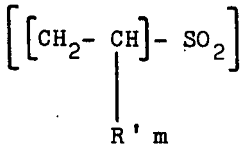

and (b) 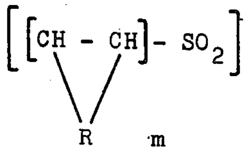

wherein *m* is an integer having a value of at least 1, R is an aromatic hydrocarbon radical selected from the group consisting of phenyl, biphenyl, naphthyl, phenanthyl, fluoroanthryl, and anthracyl radicals and R′ is a 1,8 naphthylidene radical.

* * * * *